United States Patent [19]
Iwahashi et al.

[11] Patent Number: 5,166,981
[45] Date of Patent: Nov. 24, 1992

[54] ADAPTIVE PREDICTIVE CODING ENCODER FOR COMPRESSION OF QUANTIZED DIGITAL AUDIO SIGNALS

[75] Inventors: Naoto Iwahashi; Kenzo Akagiri, both of Kanagawa, Japan

[73] Assignee: Sony Corporation, Tokyo, Japan

[21] Appl. No.: 524,088

[22] Filed: May 16, 1990

[30] Foreign Application Priority Data

May 25, 1989 [JP] Japan .................. 1-31897

[51] Int. Cl.⁵ .............................. G10L 3/00
[52] U.S. Cl. ............................. 381/36; 395/2
[58] Field of Search .................... 381/29–40, 381/49; 364/513.5; 375/122, 25

[56] References Cited

U.S. PATENT DOCUMENTS

| | | | |
|---|---|---|---|
| 4,133,976 | 1/1979 | Atal et al. | 381/41 |
| 4,354,057 | 4/1986 | Atal | 381/36 |
| 4,475,227 | 10/1984 | Belfield | 381/30 |
| 4,704,730 | 11/1987 | Turner et al. | 381/36 |
| 4,811,396 | 3/1989 | Yatsuzuka | 381/30 |

FOREIGN PATENT DOCUMENTS

331405 9/1989 European Pat. Off. .

OTHER PUBLICATIONS

ICASSP 80 Proceedings, vol. ⅜, Apr. 9, 1980, pp. 520–525, R. Visawanathan et al., "Speech-quality optimization of 16 kb/s adaptive predictive coders".

Primary Examiner—Michael R. Fleming
Assistant Examiner—Michelle Doerrler
Attorney, Agent, or Firm—Alvin Sinderbrand; William S. Frommer

[57] ABSTRACT

In an adaptive predictive coding (APC) encoder for compression of quantized digital audio, the signal-to-quantization noise ratio is improved and more complicated input signal spectra can be processed through use of an input signal frequency spectrum detector employing linear predictive coding (LPC) analysis for setting the coefficients of the requantization error noise filter. The detector operates in synchronism with the predictive and noise filters so as to minimize the number of processing calculations while maximizing processing speed.

6 Claims, 5 Drawing Sheets

ADAPTIVE PREDICTIVE CODING ENCODER FOR COMPRESSION OF QUANTIZED DIGITAL AUDIO SIGNALS

BACKGROUND OF THE INVENTION

1. Field of the Invention

The present invention relates to a digital signal processing apparatus and, more particularly, to an apparatus adapted for use in recording, reproducing and transmitting an audio signal or the like with a high quality.

2. Description of the Prior Art

In the conventional digital signal processing apparatus, there are known some examples employing the technique of adaptive predictive coding (APC) which encodes an audio signal for compression of information, hence realizing high-efficiency transmission of the audio signal while preventing deterioration of the signal-to-noise ratio and the articulation, as disclosed in Japanese Patent Laid-open Nos. 59-223033, 60-223034, 61-158217 and 61-158218.

In such digital signal processing apparatus, the spectrum of re-quantization noise is selectively switched by the technique of noise shaping to improve the aural signal-to-quantization noise ratio (SNR). (IEEE Transaction on Acoustics, Speech, and Signal Processing, Vol. ASSP-27, No. 3, June 1979; Journal of Electronic Data Communication Society, April 1987, Vol. 70, No. 4, pp. 392–400; Japanese Patent Laid-open Nos. 59-223032, 60-103746 and 61-158220)

FIG. 1 shows a conventional digital signal processing apparatus 1, wherein an input digital signal $S_I$ is fed to a predictive filter 3.

The predictive filter 3 consists of a quadratic filter circuit, and its output signal is supplied to an adder 7 so that a residual signal $S_{Z1}$, which corresponds to the difference between such output signal from the filter 3 and the input digital signal $S_I$, is fed to a maximum detector 8.

The predictive filter 3 is so formed that the frequency characteristic thereof is selectively switched in accordance with a detection output signal $S_p$ obtained from the maximum detector 8, whereby the frequency characteristic $H(z)$ of the residual signal $S_{Z1}$ to the input signal $S_I$ is corrected as expressed by a selected one of the following equations:

$$H(z) = 1 \quad (1)$$

$$H(z) = 1 - 0.9375\, z^{-1} \quad (2)$$

$$H(z) = 1 - 1.796875\, z^{-1} + 0.8125\, z^{-2} \quad (3)$$

$$H(z) = 1 - 1.53125\, z^{-1} + 0.859375\, z^{-2} \quad (4)$$

In the maximum detector 8, the detection output signal $S_p$ is produced for each predetermined segmental period on the basis of the residual signal $S_{Z1}$ and is fed to the predictive filter 3, whereby the frequency characteristic of the predictive filter 3 is selectively switched in such a manner as to lower the level of the residual signal $S_{Z1}$ outputted during each predetermined segmental period.

Thus, in case the spectrum of the input digital signal $S_I$ is distributed in a higher frequency band, the frequency characteristic represented by Eq. (1) is selected. And when the spectrum is thereby more flattened, the frequency characteristics represented by Eqs. (2), (3) and (4) are sequentially selected. In this manner, the predictive filter 3 is so switched as to minimize the residual signal $S_{Z1}$ in accordance with the spectrum of the input digital signal $S_I$.

In addition to the detection output signal $S_p$ supplied to a noise filter 9 and a predictive filter 10 its side, a floating coefficient signal $S_F$ is also outputted from the maximum detector 8 on the basis of the maximum value of the residual signal $S_{Z1}$ and then is supplied to a multiplier 11, whereby the residual signal $S_{Z1}$ corrected to a predetermined dynamic range is inputted to a re-quantizer 12.

The re-quantizer 12 is fed with the residual signal $S_{Z1}$ via an adder 13 and the multiplier 11, and after re-quantizing the residual signal $S_{Z1}$, transmits the same to the receiving side.

At the receiving side, the transmitted signal $S_{L1}$ is supplied through a transmission line L1 to the predictive filter 10 via a multiplier 18, which is inverse in characteristic to the aforementioned multiplier 11, and also via an adder 20, and then the output signal of the predictive filter 10 is fed back to the adder 20.

The frequency characteristic of the predictive filter 10 is switched similarly to the predictive filter 3 in accordance with the detection output signal $S_p$ to consequently decode the transmitted signal $S_{L1}$, hence realizing improved transmission of the input digital signal $S_I$ with a high efficiency enhanced by a value corresponding to the transmission of the residual signal $S_{Z1}$ instead of the input digital signal $S_I$.

In this stage of operation, the re-quantizer 12 is supplied with the signal $S_{Z2}$ which is the difference between the input and output signals and is obtained by an adder 21, and such difference signal $S_{Z2}$ is fed back to the adder 13 via a multiplier 22, which is inverse in characteristic to the multiplier 11, and also via a noise filter 9.

The noise filter 9 is so formed as to selectively switch the frequency characteristic in accordance with the detection output signal $S_p$.

When the predictive filter 3 is switched to the frequency characteristic represented by Eq. (1), the amount of feedback of a higher frequency component is reduced.

Therefore, in case the spectrum of the input digital signal $S_I$ is distributed in a higher frequency band, the noise generated during the re-quantization (hereinafter referred to as re-quantization noise) is emphasized in the higher frequency band when the signal is decoded, whereby the spectrum of the re-quantization noise is approximated to that of the input digital signal $S_I$, and the signal-to-quantization noise ratio is improved by utilizing this aural masking effect.

Meanwhile, if any of the frequency characteristics represented by Eqs. (2), (3) and (4) is selected, the filter characteristic is switched to that of the predictive filter 3, so that when the signal is decoded, the spectrum of the re-quantization noise is flattened and the energy thereof is minimized.

In case the technique of noise shaping is applied to the input digital signal $S_I$ having a complicated spectrum as graphically shown in FIG. 2, it is rendered possible to improve the aural signal-to-quantization noise ratio most effectively by approximating the spectrum of the re-quantization noise $S_N$ to that of the input digital signal $S_I$. (Hereinafter this technique will be referred to as optimum noise shaping.)

However, with the known circuit configuration of FIG. 1 where the predictive filter 3 is switched between four frequency characteristics and the noise filter 9 is selectively switched in conformity therewith, there exists a problem that optimum noise shaping cannot be applied to the input digital signal $S_I$ having various spectra, whereby sufficient enhancement is not achievable in the signal-to-quantization noise ratio.

OBJECTS AND SUMMARY OF THE INVENTION

An object of the present invention is to capable of improving the signal-to-quantization noise ratio in comparison with any conventional apparatus.

According to one aspect of the present invention, there is provided a digital signal processing apparatus for encoding an input digital signal, comprising predictive filter means supplied with the input digital signal for generating a filtered output; control means for controlling a frequency characteristic of the predictive filter means; predictive error detecting means for detecting a difference signal between the input digital signal and the filtered output; frequency spectrum detecting means for detecting a frequency spectrum of the input digital signal during predetermined periods; re-quantizing means for re-quantizing the difference signal; re-quantizing error detecting means for detecting a re-quantizing error signal; noise filter means for receiving the re-quantizing error signal, an output signal of such noise filter means being fed back to the input of the re-quantizing means; and noise filter control means for controlling the frequency characteristic of the noise filter means in response to the output of the frequency spectrum detecting means.

According to another aspect of the present invention, the digital signal processing apparatus further comprises buffer memory means provided at the input side of the frequency spectrum detecting means, and such buffer memory means divides the input digital signal into the predetermined periods and supplies the signal of each such period to the frequency spectrum detecting means.

According to still another aspect of the present invention, the control means switches the frequency characteristics of the predictive filter means for each predetermined period in response to the difference signal.

According to a further aspect of the present invention, the input signal level of the re-quantizing means is controlled in conformity with the output of the control means.

And according to an even further aspect of the present invention, the frequency spectrum detecting means has a linear predictive coding (LPC) analyzer.

In this apparatus, synchronism is maintained among detection of the spectrum, switchover of the predictive filter and switchover of the noise filter, so that the number of calculations required for detecting the spectrum and selectively determining the frequency characteristic of the noise filter is reduced to consequently achieve efficient re-quantization of the input digital signal, hence improving the signal-to-quantization noise ratio with a simplified structure in comparison with the conventional apparatus.

The above and other objects and features of the present invention will be apparent from the following description which will be given with reference to the illustrative accompanying drawings.

DESCRIPTION OF THE PREFERRED EMBODIMENT

Hereinafter an exemplary embodiment of the present invention will be described in detail with reference to the accompanying drawings.

Figure 1:
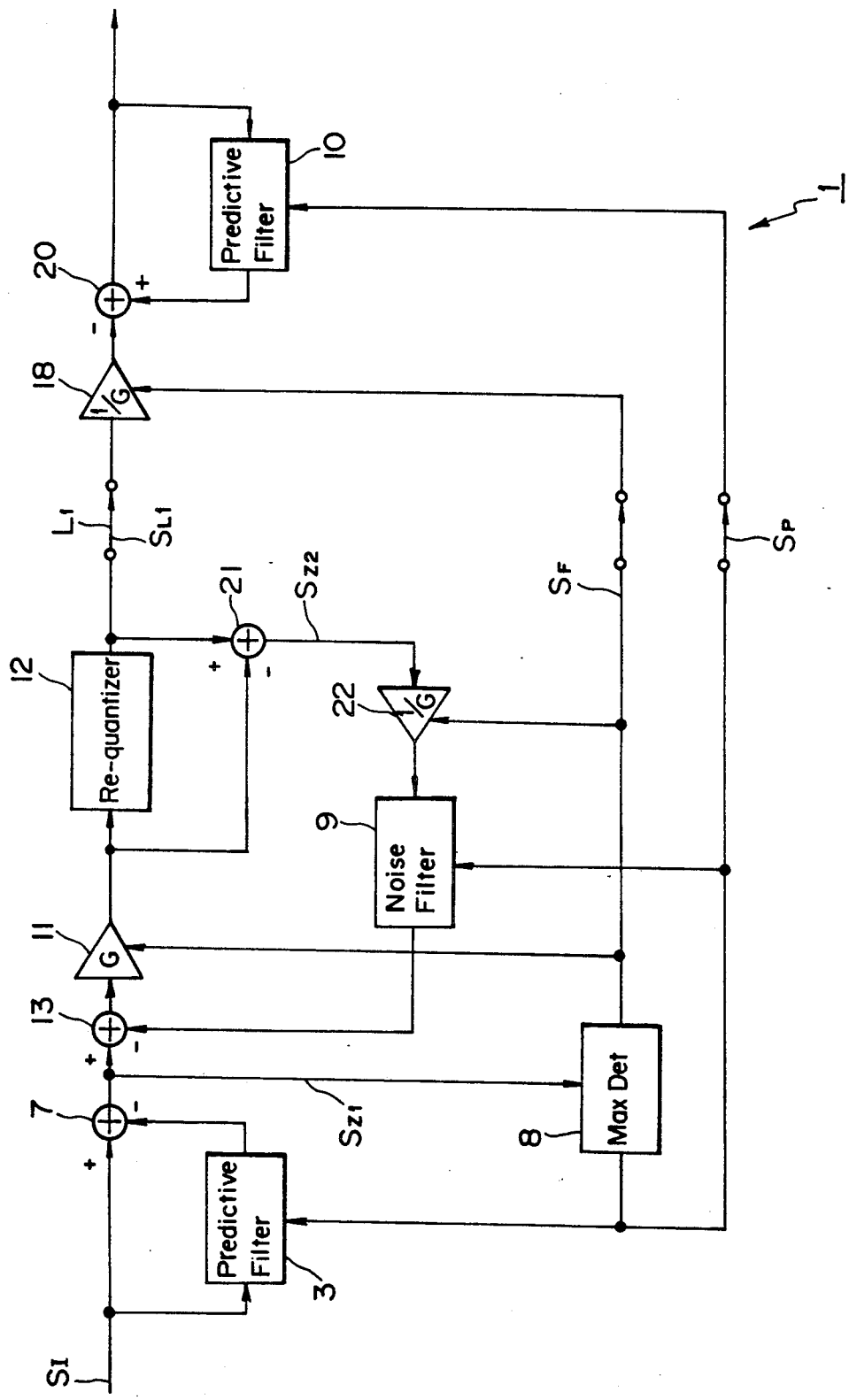
FIG. 1 is a block diagram showing a conventional digital signal processing apparatus.
Figure 2:
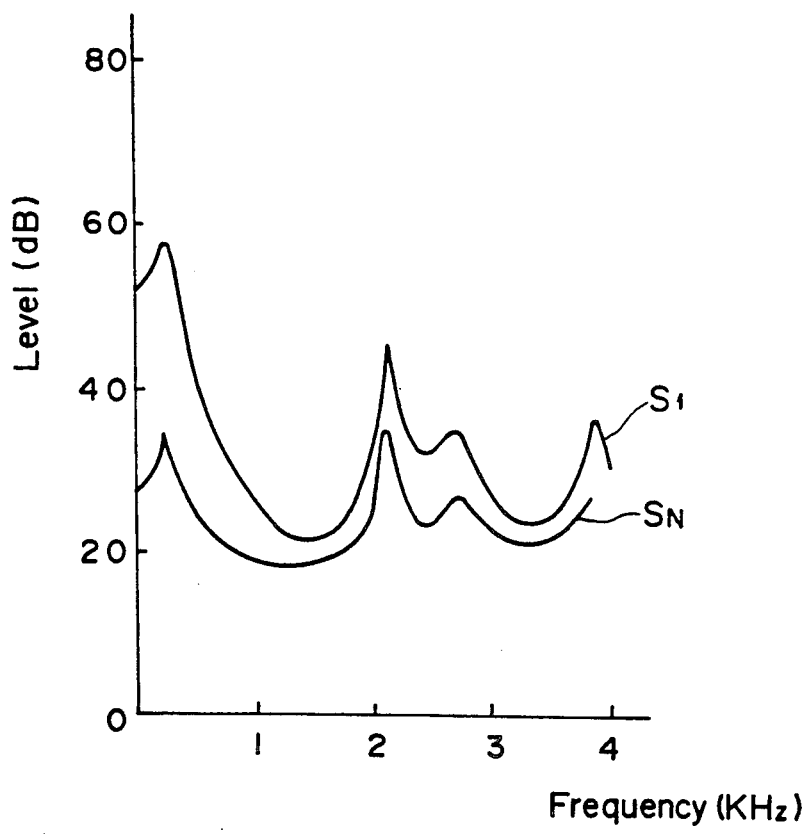
FIG. 2 is a schematic diagram for explaining the defects encountered in the conventional digital signal processing apparatus shown in FIG. 1.
Figure 3:
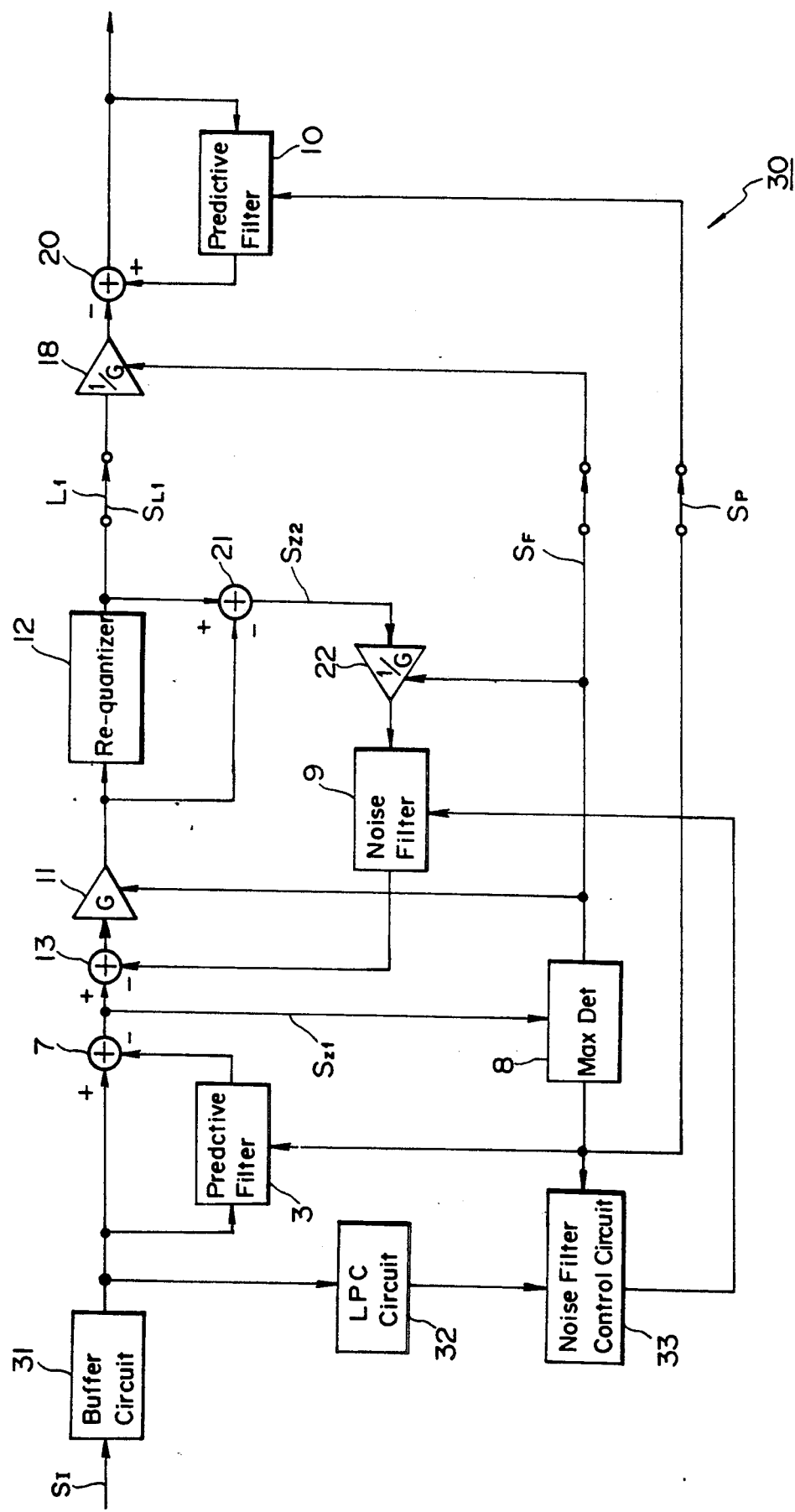
FIG. 3 is a block diagram showing an embodiment of a digital signal processing apparatus of the present invention.

In FIG. 3, components corresponding to those used in FIG. 1 are denoted by the same reference numerals and symbols. Denoted by 30 is a digital signal processing apparatus as a whole designed for re-quantizing an input digital signal $S_I$ of 16 bits and outputting the processed signal.

In the digital signal processing apparatus 30, a 28-sample input digital signal $S_I$ is fed to a buffer circuit 31 and, upon completion of processing such input digital signal $S_I$, a next 28-sample input digital signal $S_I$ is fed to the buffer circuit 31.

In conformity with the above operation, the 28 samples of the input digital signal $S_I$ are sequentially stored in the buffer circuit 31 and then are outputted therefrom.

Thus, in the digital signal processing apparatus 30, the 28 samples of the input digital signal $S_I$ are processed as a unitary batch. (Hereinafter such input digital signal $S_I$ composed of 28 samples as one unit will be referred to as a 1-block input digital signal $S_I$). The frequency characteristics of both a predictive filter 3 and a noise filter 9 are switched also for each block.

Meanwhile a linear predictive coding (LPC) analyzer 32 serves to analyze the input digital signal $S_I$ obtained from the buffer circuit 31 and detects the spectrum of the digital signal $S_I$ for each block.

Furthermore, the LPC analyzer 32 feeds the result of such detection to a noise filter controller 33. In this case the LPC analyzer 32 provides to the controller 33, z-converted data of coefficients a1, a2 for expressing the spectrum X(z) of the input digital signal $S_I$ by the following equation:

$$X(z) = 1 + a_1 z^{-1} + a_2 z^{-2} \tag{5}$$

Then the noise filter controller 33 selectively determines the frequency characteristic of the noise filter 9 for each block on the basis of the detection output signal Sp and the data of coefficients a1, a2.

That is, for approximating the spectrum of the re-quantization noise $S_N$ to the spectrum X(z) of the input digital signal $S_I$ represented by Eq. (1), it is necessary to shape the re-quantization noise to N(z) which is expressed as follows:

$$\begin{aligned} N(z) &= X(z/\alpha) \\ &= 1 + a_1 \alpha z^{-1} + a_2 \alpha^2 z^{-2} \end{aligned} \tag{6}$$

where $0 < \alpha < 1$

Therefore, when the frequency characteristic of the predictive filter 3 is set as Eq. (7) correspondingly to Eqs. (1) through (4):

$$P(z) = b\,z^{-1} \qquad (7)$$

and, in which the term "b" in Eq. (7) is a constant when the predictive filter is set to correspond to one of Eqs. (1) and (2), and the term "b" depends on the previous input signal sample when the predictive filter is set to correspond to Eq. (3) or (4), the frequency characteristic $H(z)$ for the residual signal $S_{Z1}$ is simply expressed as:

$$\begin{aligned} H(z) &= 1 - P(z) \\ &= 1 - bz^{-1} \end{aligned} \qquad (8)$$

then, it is found that the frequency characteristic $R(z)$ of the noise filter 9 may be selectively determined as $$R(z) = 1 - N(z)H(z) \qquad (9)$$

Thus, substituting Eqs. (8) and (6) for Eq. (9), the latter can be rewritten as:

$$\begin{aligned} R(z) &= 1 - N(z)(1 - P(z)) \qquad (10)\\ &= 1 - N(z) + N(z)P(z) \\ &= 1 - (1 + a_1\,\alpha z^{-1} + a_2\,\alpha^2 z^{-2}) + \\ &\quad (1 + a_1\,\alpha z^{-1} + a_2\,\alpha^2 z^{-2})\,bz^{-1} \\ &= (-a_1\,\alpha + b)z^{-1} + \\ &\quad (-a_2\,\alpha^2 + a_1\,\alpha b)z^{-2} + 2\,a_2\,\alpha^2 b z^{-3} \\ &= \beta_1 z^{-1} + \beta_2 z^{-2} + \beta_3 z^{-3} \\ \beta_1 &= -a_1\,\alpha + b \\ \beta_2 &= -a_2\,\alpha^2 + a_1\,\alpha b \\ \beta_3 &= a_2\,\alpha_2 b \end{aligned}$$

The data for coefficients $\beta_1$, $\beta_2$, $\beta_3$ represented by Eq. (10) are outputted from the noise filter controller 33 and are fed to the noise filter 9 for each block, whereby the frequency characteristic of the filter 9 is switched.

Thus, the spectrum of the input digital signal $S_I$ is detected by applying the technique of linear predictive coding, and then the frequency characteristic of the noise filter 9 is switched on the basis of the result of such detection, so that optimum noise shaping can be performed for each block to consequently improve the signal-to-quantization noise ratio in comparison with the conventional apparatus by effectively utilizing the aural masking effect.

In execution of such optimum noise shaping as mentioned, if the number of samples to be analyzed by linear predictive coding is reduced to permit more frequent switchover of the noise filter 9, it becomes possible to approximate the spectrum of the quantization noise more exactly to that of the input digital signal $S_I$, hence further improving the signal-to-quantization noise ratio.

Thus, reducing the number of samples to be analyzed by linear predictive coding results in a increase in the frequency of such analysis.

Therefore the number of calculations required for detecting the spectrum is increased to consequently lower the speed of processing the input digital signal $S_I$.

By contrast, if the number of samples to be analyzed by the linear predictive coding is increased, the linear predictive coding analysis is performed less frequently.

Figure 4:
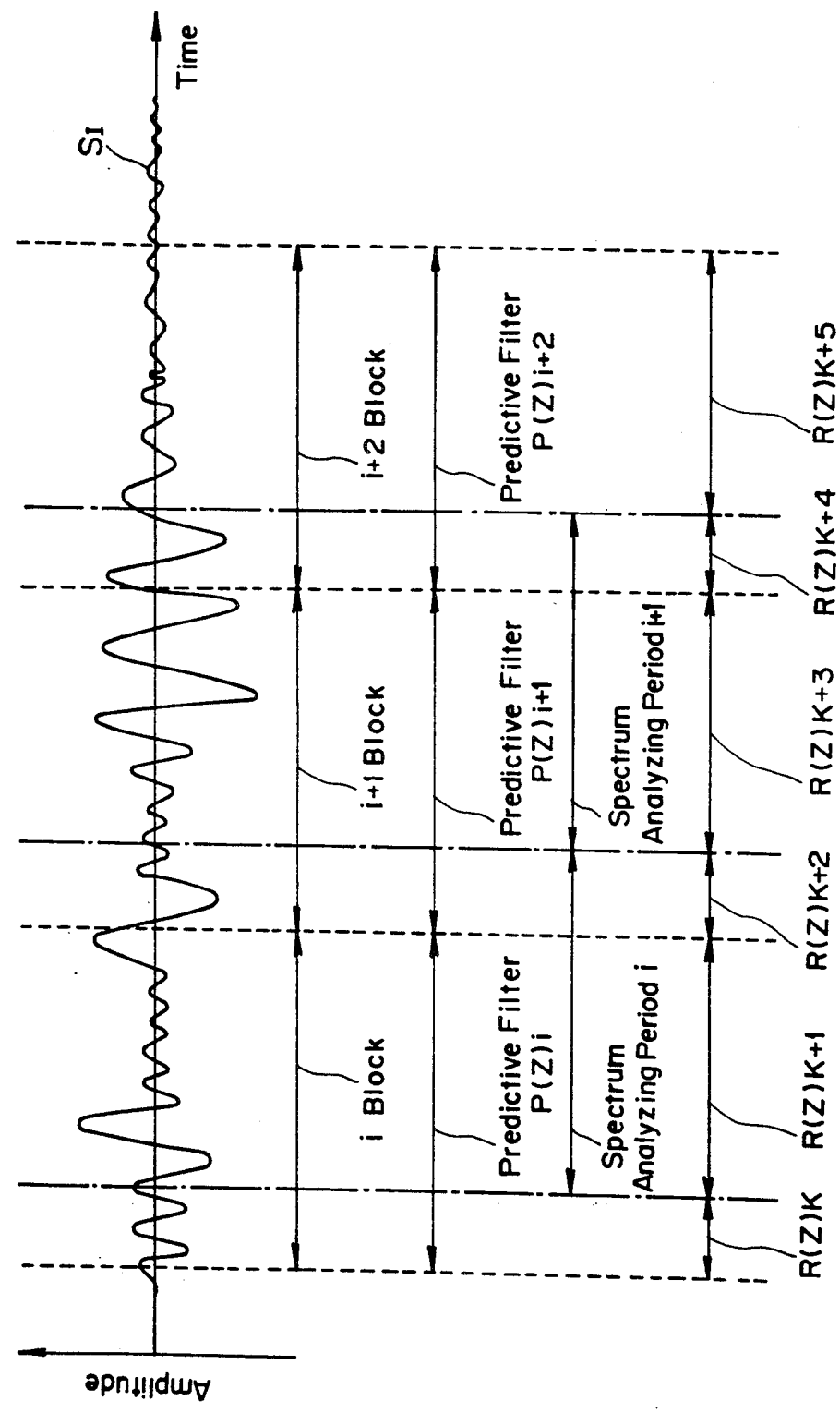
FIGS. 4 and 5 are schematic diagrams showing time charts for explaining the operation of the digital signal processing apparatus of FIG. 3.

However, even with numerical increase of samples to be analyzed by linear predictive coding, if there occurs a deviation of the linear predictive coding block (i.e. spectrum analysis block), as shown in FIG. 4, from the timing to switch the frequency characteristic of the predictive filter 3 sequentially to $P(z)_i$, $P(z)_{i+1}$, $P(z)_{i+2}$, and so forth, then it follows that the coefficients $\beta_1$, $\beta_2$, $\beta_3$ of the noise filter 9 are computed in the deviated blocks, whereby the required number of operation for calculating the coefficients is increased in this case also.

In this embodiment, therefore, the buffer circuit 31 is provided to execute linear predictive coding for each block of 28 samples, and both the predictive filter 3 and the noise filter 9 are switched for each block in such a manner that synchronism is maintained among execution of the linear predictive coding, switchover of the predictive filter 3, and switchover of the noise filter 9.

Figure 5:
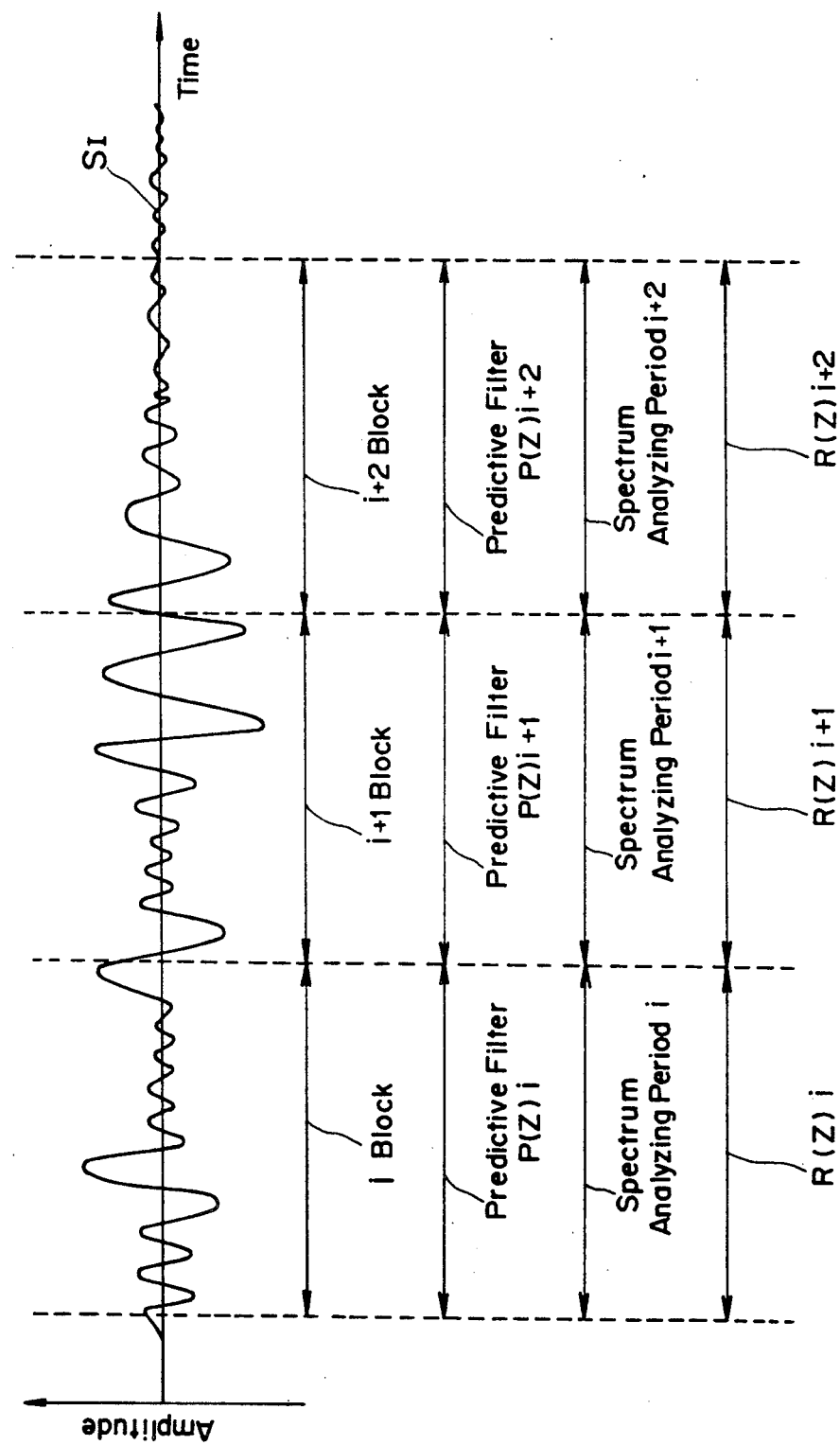

That is, when the frequency characteristic of the predictive filter 3 is switched sequentially to $P(z)_i$, $P(z)_{i+1}$, $P(z)_{i+2}$, and so forth in accordance with the input digital signal $S_I$, as shown in FIG. 5, the linear predictive coding is performed synchronously therewith, and the frequency characteristic of the noise filter 9 is switched sequentially to $R(z)_i$, $R(z)_{i+1}$, $R(z)_{i+2}$, and so forth on the basis of the result of such spectrum analysis and the frequency characteristics $P(z)_i$, $P(z)_{i+1}$, $P(z)_{i+2}$, and so forth of the predictive filter 3.

Thus, the above contrivance reduces the amount of operation required for selecting the frequency characteristics of the noise filter 9 and also for the linear predictive coding within a wide range sufficient in practical use, hence achieving efficient re-quantization of the input digital signal $S_I$.

As a result, the whole constitution of the digital signal processing apparatus 30 can be simplified correspondingly thereto.

Thus, in this embodiment, the buffer circuit 31 and the LPC analyzer 32 constitutes spectrum detector means which divides the input digital signal $S_I$ into predetermined segmental periods and detects the spectrum of such input digital signal $S_I$ for each predetermined segmental period. Meanwhile the predictive filter 3 constitutes predictive filter means whose frequency characteristic is selectively switched for each predetermined segmental period in accordance with the input digital signal $S_I$ or the difference signal $S_{Z1}$ outputted from an adder 7, in such a manner as to reduce the maximum value of the frequency spectrum thereof.

Furthermore, the adder 7 constitutes predictive error detector means for outputting a difference signal $S_{Z1}$ between the input digital signal $S_I$ and the output signal of the predictive filter 3; and the multiplier 11 and the re-quantizer 12 constitute re-quantizer means for re-quantizing the difference signal $S_{Z1}$ and outputting the same.

In addition, the noise filter 9 constitutes noise filter means whose frequency characteristic is selectively switched for each segmental period correspondingly to the frequency characteristic of the input digital signal in accordance with the result of detection by the spectrum detector means and feeding back to the re-quantizer means the re-quantization error signal $S_{Z2}$ generated during the re-quantization.

In the above described circuit arrangement, the input digital signal $S_I$ is fed to the buffer circuit 31 at the rate of 28 samples as a unitary batch, so that 28 samples are processed during one predetermined segmental period in the digital signal processing apparatus 30.

Meanwhile, the input digital signal $S_I$ stored in the buffer circuit 31 is analyzed by linear predictive coding in the LPC analyzer 32, so that the spectrum of the signal is detected.

Furthermore, the input digital signal $S_I$ stored in the buffer circuit 31 is outputted to both the predictive filter 3 and the adder 7, so that the residual signal $S_{Z1}$ is fed to a maximum detector 8, whereby the frequency characteristic of the predictive filter 3 is selectively switched to correspond to one of Eqs. (1) through (4) in such a manner as to minimize the level of the residual signal $S_{Z1}$.

Therefore the residual signal $S_{Z1}$ is outputted via an adder 13 and a multiplier 11 to a re-quantizer 12, where the residual signal $S_{Z1}$ is re-quantized and then transmitted to the receiving side.

The transmitted signal $S_{L1}$ is also outputted to an adder 21, so that a re-quantization error signal $S_{Z2}$ is obtained between such transmitted signal $S_{L1}$ and the input signal fed to the re-quantizer 12, and thus the re-quantization error signal $S_{Z2}$ generated during the re-quantization is detected.

The re-quantization error signal $S_{Z2}$ is fed back to the adder 13 via a multiplier 22 and the noise filter 9. In this stage, the frequency characteristic of the noise filter 9 is selectively switched in accordance with the result of operation of the LPC analyzer 32 and the frequency characteristic of the predictive filter 3, whereby optimum noise shaping is executed to attain approximation to the spectrum of the input digital signal $S_I$.

Due to the circuit arrangement described above, the spectrum of the input digital signal $S_I$ is detected in each of predetermined segmental periods, and the frequency characteristic of the noise filter 9 is selectively switched in accordance with the result of such detection and the frequency characteristic of the predictive filter 3, whereby optimum noise shaping can be executed.

In the above procedure, synchronism is maintained among detection of the spectrum, switchover of the predictive filter 3 and switchover of the noise filter 9, so that the number of calculations required for detecting the spectrum and selectively determining the frequency characteristic of the noise filter 9 is reduced to consequently achieve efficient re-quantization of the input digital signal $S_I$, hence improving the signal-to-quantization noise ratio with a simplified structure in comparison with the conventional apparatus.

The embodiment mentioned above is concerned with an exemplary case where the frequency characteristic of the predictive filter 3 is selectively switched to correspond to one of Eqs. (1) through (4). However, the present invention is not limited to this example alone and may be applied in some other case where the frequency characteristic of the predictive filter 3 is switched to one of a variety of frequency characteristics.

It is also to be understood that, in addition to the above embodiment where the frequency characteristics of the noise filter 9 are selectively switched in accordance with the results of detections of the LPC analyzer 32 and the maximum detector 8 while the frequency characteristic of the predictive filter 3 is selectively switched in accordance with the output of the maximum detector 8, the present invention may be so modified as to switch the frequency characteristic of the predictive filter 3 in combination with the result of detection of the LPC analyzer 32.

According to the present invention, as described hereinabove, an input signal is divided into predetermined segmental periods and, after the spectrum thereof is analyzed in each of such periods, the frequency characteristics of both a predictive filter and a noise filter are selectively switched in accordance with the detected spectrum, so that the required operation is simplified in execution of optimum noise shaping for each predetermined segmental period, hence attaining an improvement in the signal-to-quantization noise ratio as compared with conventional apparatus.

What is claimed is:

1. An apparatus for processing an input digital signal, comprising:

predictive filter means having a controllable filter characteristic and being supplied with said input digital signal for generating a filtered output;

predictive error detecting means for detecting a predictive error signal as a difference between said input digital signal and said filtered output;

predictive filter control means for switching said controllable frequency characteristic of said predictive filter means for each of a plurality of predetermined periods in response to said predictive error signal;

frequency spectrum detecting means for detecting the frequency spectrum of said input digital signal during said predetermined periods and providing corresponding output signals;

re-quantizing means for re-quantizing said predictive error signal;

re-quantizing error detecting means connected to an input and an output of said re-quantizing means for outputting a re-quantizing error signal as a difference between said input and output of said re-quantizing means;

noise filter means for receiving said re-quantizing error signal and having a changeable frequency characteristic;

means for feeding back an output signal of said noise filter means to said input of said re-quantizing means; and noise filter control means for controlling said changeable frequency characteristic of said noise filter means in response to said output signals of said frequency spectrum detecting means.

2. An apparatus for processing an input digital signal according to claim 1, further comprising buffer memory means provided at an input side of said frequency spectrum detecting means for dividing said input digital signal into said predetermined periods and for providing said input digital signal at each of the periods to said frequency spectrum detecting means.

3. An apparatus for processing an input digital signal according to claim 2, wherein said noise filter control means switches said changeable frequency characteristic of said noise filter means at each of said predetermined periods in response to said output of said frequency spectrum detecting means and also an output of said predictive filter control means.

4. An apparatus for processing an input digital signal according to claim 3, wherein said frequency characteristics of said predictive filter means and said noise filter means, respectively, are selectively switched among several predetermined frequency characteristics in synchronism with operation of said frequency spectrum detecting means during said predetermined periods.

5. An apparatus for processing an input digital signal according to claim 1, further comprising means for controlling a signal level at said input of said requantizing means in accordance with an output of said predictive filter control means.

6. An apparatus for processing an input digital signal according to claim 1, wherein said frequency spectrum detecting means includes linear predictive coding analysis means.

* * * * *